United States Patent [19]

Nii

[11] Patent Number: 5,247,192
[45] Date of Patent: Sep. 21, 1993

[54] HETEROJUNCTION BIPOLAR TRANSISTOR

[75] Inventor: Keita Nii, Kyoto, Japan

[73] Assignee: Rohm Co., Ltd., Kyoto, Japan

[21] Appl. No.: 901,630

[22] Filed: Jun. 19, 1992

[30] Foreign Application Priority Data

Sep. 30, 1991 [JP] Japan .................................. 3-251918

[51] Int. Cl.$^5$ .............. H01L 31/0312; H01L 31/0256; H01L 31/072; H01L 31/109
[52] U.S. Cl. ........................................ 257/77; 257/76; 257/197; 257/198; 257/49
[58] Field of Search .......................... 357/34, 35, 16, 2

[56] References Cited

FOREIGN PATENT DOCUMENTS 62-216364 9/1987 Japan .
2073486 10/1981 United Kingdom .................. 357/34

OTHER PUBLICATIONS

"The Estimate of Base-collector Heterojunction Effect in SiGe base HBT", Mamoru Ugajin and Yoshihito Amemiya, NTT LSI Laboratories, Jan. 27, 1988.

Primary Examiner—Rolf Hille
Assistant Examiner—Wael Fahmy
Attorney, Agent, or Firm—Nikaido, Marmelstein, Murray & Oram

[57] ABSTRACT

A heterojunction bipolar transistor comprising a semiconductor substrate of a first conductive-type, a first conductive-type layer of 3c-SiC, a second conductive-type layer of Si and another first conductive-type layer of 3c-SiC. The two first conductive-type layers serve respectively as collector region and emitter region and the second conductive-type layer serves as base region, and a method for producing the same. A transistor of the present invention is effective for devices such as I$^2$L circuit wherein reverse directional operation of transistor is utilized.

1 Claim, 5 Drawing Sheets

HETEROJUNCTION BIPOLAR TRANSISTOR

BACKGROUND OF THE INVENTION

The present invention relates to a heterojunction bipolar transistor (hereinafter referred to as HBT) capable of rapidly operating. More particularly the present invention relates to a wide band gap HBT.

To make a conventional homojunction transistor operate rapidly, it is necessary to form a thin base region. However a thin base region undesirably causes a punch through. On the other hand, if the concentration of the base region is made high to prevent the punch through, the gain of the transistor is lowered. Thus, there is a limit in realizing both high gain and rapid operation in conventional transistors.

In the view of the above-mentioned circumstances, earnest researches of Si(silicon)-HBT have been made to realize rapid operation in Si bipolar transistors. As Si-HBT which have been studied, there are wide-gap-emitter-type ones, wherein material such as silicon carbide having a wider band gap than that of Si is applied to an emitter, and narrow-gap-base-type ones, wherein material such as mixed crystal of Si and Ge having a narrower band gap than that of Si is applied to a base region.

In a conventional wide band gap HBT, Si semiconductor crystal is applied to collector region and base region, and 3c-SiC (3c-silicon carbide or $\beta$-SiC), which has a wider band gap than that of Si, is applied to emitter region so that emitter injection efficiency increases and base resistance decreases. Thus the conventional wide band gap HBT is used as an element for rapid operation and high power. These are disclosed in Japanese Unexamined Patent Publication No. 216364/1987.

However, the conventional wide band gap HBT, wherein the same semiconductor material (Si) as that of base region is applied to collector region and positive holes are injected from the base to the collector, has a problem that a large amount of positive holes accumulate in the collector region due to a comparatively thick collector region so that diode operation becomes tardy.

On the other hand, in a conventional HBT wherein SiGe having a narrow band gap is applied to base region, the injection of positive holes into collector region (n-type) is prevented thanks to the band gap difference, caused by the heterojunction, between the base region and collector region, and the width of baser region can be made small to be about 10 nm to reduce the number of electrons accumulated therein. Because operation speed of transistor depends on an amount of accumulated electrons in base region (p-type), high speed operation can be realized. This is disclosed in "Estimate of effects of heterojunction between base and collector in SiGe based HBT" by Ugami and Amamiya, pages 25 to 30, 1988, SDM88-142, The Journal of the Institute of Electronics, Information and Communication Engineers. However, this type of HBT requires MBE apparatus or the like when the formation of heterojunction is performed so that it leaves problems in productivity, cost or the like.

In view of the above-mentioned problems, an object of the present invention is to provide a heterojunction bipolar transistor, which is easily produced and is capable of rapidly operating.

SUMMARY OF THE INVENTION

A HBT of the present invention is constructed as follows. On a semiconductor substrate of a first conductive-type, a first conductive-type layer of 3c-SiC, a second conductive-type layer of Si and another first conductive-type layer of 3c-SiC are formed in this order so that the two first conductive-type layers serve respectively as collector region and emitter region and the second conductive-type layer serves as base region.

A method for producing a HBT of the present invention comprises:

a step for forming a first insulating film on a semiconductor substrate and for forming an opening on the first insulating film at a position where a collector region is to be formed;

a step for forming a monocrystal layer of 3c-SiC in the opening;

a step for forming a second insulating film on the monocrystal layer of 3c-SiC;

a step for forming a poly Si film and a third insulating film on the semiconductor substrate, and for removing the poly Si film and the third insulating film existing on the monocrystal layer by etching and a step for removing the second insulating film in the opening by etching and forming on the monocrystal layer a layer of Si and a layer of SiC in this order.

According to a bipolar transistor of the present invention, 3c-SiC layer having a wider band gap than that of Si layer utilized as a base region is applied not only to an emitter region but also to a collector region to form a wide band gap HBT. Thanks to this structure, positive holes are not injected from the base to the collector and junction capacitance can be lowered, whereby a HBT of the present invention provides a high gain and rapid operation.

According to a method of the present invention, before the formation of poly Si film which ohmicly contacts with the base region, the second insulating film is formed on the monocrystal layer of 3c-SiC intended for a collector region. Because the second insulating film serves as a protecting film when removing the poly Si film by etching from a position where the bsae region and the emitter region are to be formed, damage on the 3c-SiC layer by etching can be reduced. Thus, a semiconductor junction with good crystal structure is realized.

DETAILED DESCRIPTION

Figure 1:
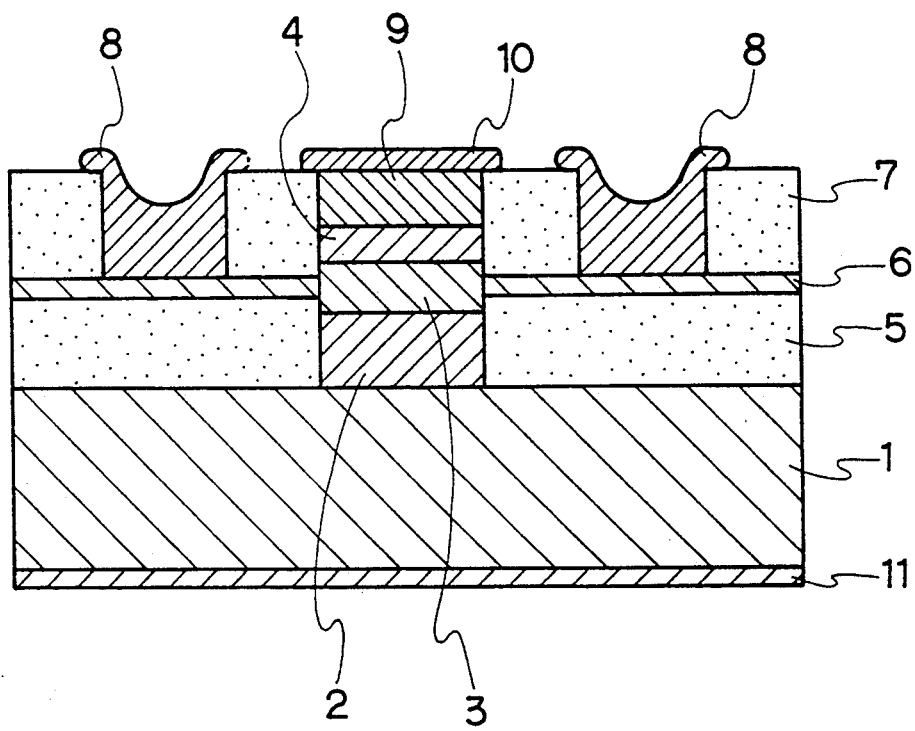
FIG. 1 is a cross section of an embodiment of a HBT of the present invention.

The present invention is explained below with reference to the drawings. FIG. 1 is a cross section of an embodiment of a HBT of the present invention.

In FIG. 1 numeral 1 denotes a semiconductor substrate of n-type Si and numeral 2 denotes a n-type 3c-SiC layer of the same conductive-type as the substrate 1. The layer 2 serves as collector region of a transistor. Numeral 3 denotes a p-type Si layer serving as base region of the transistor. Numeral 4 denotes a n-type 3c-SiC layer serving as emitter region of the transistor. Numeral 5 denotes a first insulating film. Numeral 6 denotes a P+-type poly Si film which ohmicly contacts with the base region 3 and provides a connection between a base electrode 8 and the base region 3. Numeral 7 denotes a third insulating film which covers the surface of the poly Si film 6 to insulatingly protect it. The film 7 is partially removed to provid an opening, and an aluminium film is deposited in the opening by, for example evaporation, to form a base electrode 8. Numeral 9 denotes a n+-type poly Si film formed on the emitter region 4. The film 9 ohmicly contacts with the emitter region 4, and an emitter electrode 10 of aluminium is formed on the film 9. Numeral 11 denotes an aluminium film formed on a reverse side of the substrate 1. The layer 11 serves as a collector electrode.

The collector region 2, base region 3 and emitter region 4 constitute an ordinary longitudinal-type transistor. Difference in this constitution from conventional ones is that the base region 3 is formed with semiconductor crystal layer of Si, and the collector region 2 and emitter region 4 are formed with semiconductor layer of 3c-SiC, that is, this transistor is a double-heterojunction type one wherein two 3c-SiC layers are formed at both sides of a semiconductor crystal layer of Si serving as base region.

As explained above, a 3c-SiC layer has a wider band gap than that of Si layer. Accordingly, with respect to base and emitter, injection of carriers from base to emitter can be prevented, as explained in the case of the conventional wide band gap HBT, so that base resistance can be lowered by increasing doping concentration of the base. Thus, amplification factor and operation speed can be increased, and the transistor is available even for high frequency operation. In a HBT of the present invention, collector region is also formed with a 3c-SiC layer having a wider band gap to realize a heterojunction, whereby injection of positive holes from the base region 3 to the collector region 2 is prevented, junction capacitance between the base region 3 and the collector region 2 is not increased, and operation speed depends on only the accumulated amount of electrons in the base region 3. In a transistor of the above structure, punch through does not appear and width of base region can be made small to be about 10 nm thanks to the heterojunction of different materials having different band gap. Thus, a small amount electrons is accumulated in the base region to realize a further rapid operation.

Though, in the above embodiment, the explanation is made based on a npn transistor formed on a n-type semiconductor substrate, it is needless to say that the same effect can be obtained in the case of a pnp transistor, the conductive-type thereof is contrary to the npn transistor.

A method for producing an embodiment of a HBT of the present invention is explained below. FIGS. 2 to 7 are respectively a view showing each step in producing a HBT.

Figure 2:
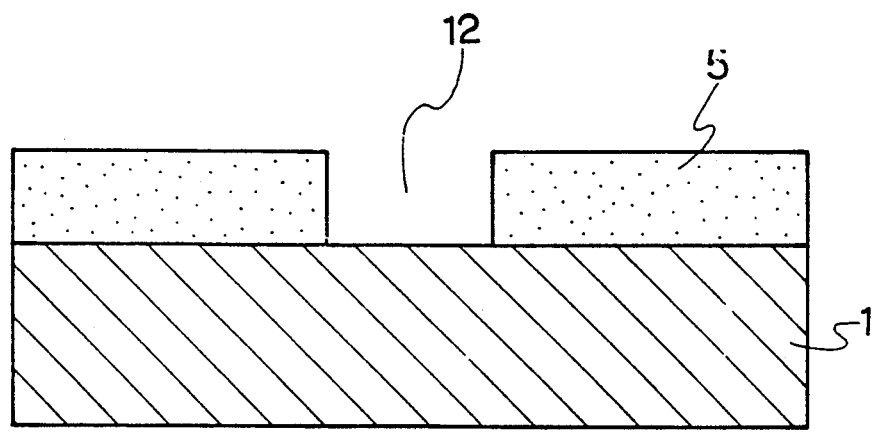
FIGS. 2 to 7 are respectively an explanatory view showing each step in producing an embodiment of a HBT of the present invention.

As shown in FIG. 2, a first insulating film 5 is formed on a semiconductor substrate 1, and an opening 12 is formed at the film 5 at a position where a collector region is to be formed. Concretely, an silicon oxide film of 1000 Å in thickness as the insulating film 5 is formed on a n-type (111) Si substrate 1 by thermal treatment at 900° C. for 20 minutes. Thereafter, an opening 12 is formed at a portion of the film 5 where a collector region is to be formed by HF etching with a photoresist.

Figure 3:
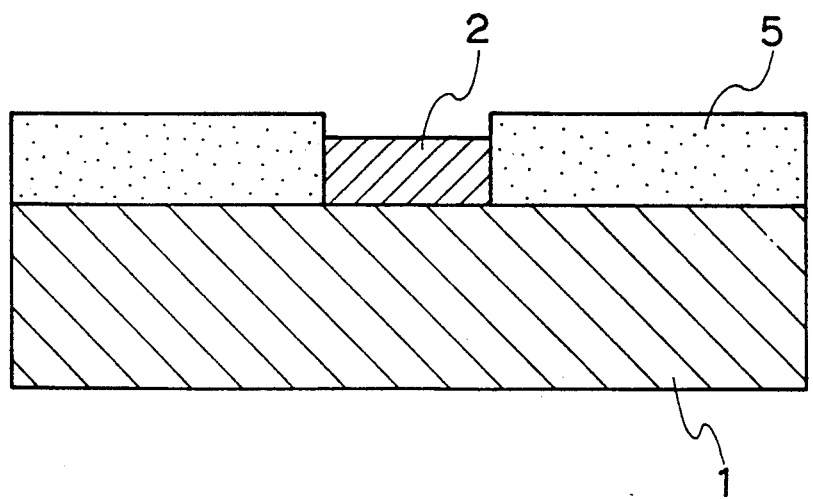

Next, as shown in FIG. 3, a 3c-SiC monocrystal layer 2 is allowed to selectively grow in the opening 12. Concrete conditions for this growth are as follows. The growth is performed by RFCVD at 1300° C. for 10 minutes with RF frequency of 13.56 MHz, and with 0.5 sccm of $Si_2H_6$ and 0.5 sccm of $C_2H_2$ respectively as gaseous material source, 3 slm of $H_2$ as carrier gas, and 15 sccm of HCl added thereto. Thus a n-type 3c-SiC layer 2 of 900 Å in thickness is formed.

Figure 4:
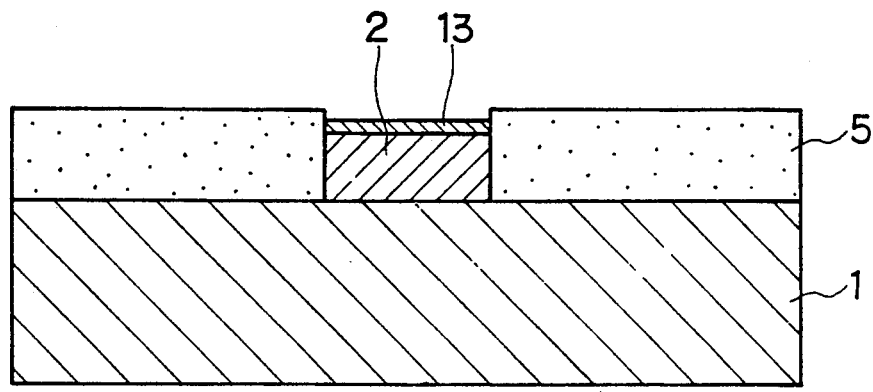

As shown in FIG. 4, a second insulating film 13 is formed on the 3c-SiC monocrystal layer 2 and the first insulating film 5. Concretely, an oxide film of 300 Å in thickness is formed by thermal treatment at 900° C. for 30 minutes. This second insulating film 13 is formed in order to reduce etching damage at later etching of a poly Si film 6 on the 3c-SiC monocrystal layer.

Figure 5:
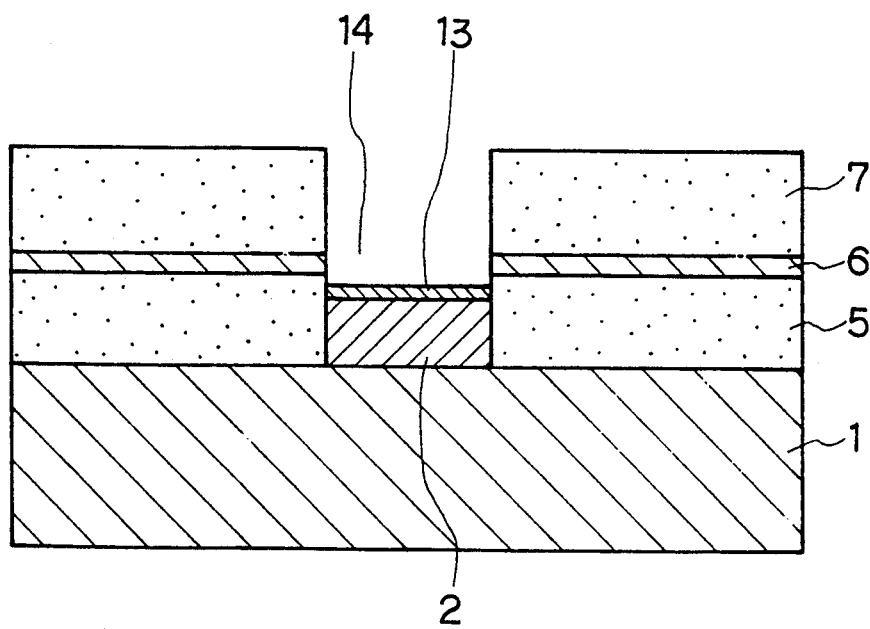

Then, as shown in FIG. 5, a poly Si film 6 and a third insulating film 7 are formed on the substrate 1 in this order, and thereafter the films 6 and 7 on collector region is removed by etching to form an opening 14. Concretely, 1 sccm of $SiH_4$ as gaseous material source and 0.05 sccm of $B_2H_6$ as gaseous impurity are introduced and thermal treatment is performed at 700° C. for 5 minutes by CVD to deposite P+-type poly Si film 6 of 300 Å in thickness. 200 sccm of TEOS (tetra.ethyl.ortho.silicate) and 200 sccm of oxygen are introduced and thermal treatment is performed at 400° C. for 30 seconds by CVD to deposite silicon oxide of 2000 Å in thickness to form a third insulating film. Thereafter, the poly Si film 6 and the third insulating film 7 is etched and removed by RIE with the same mask as used in forming the opening 12.

Figure 6:
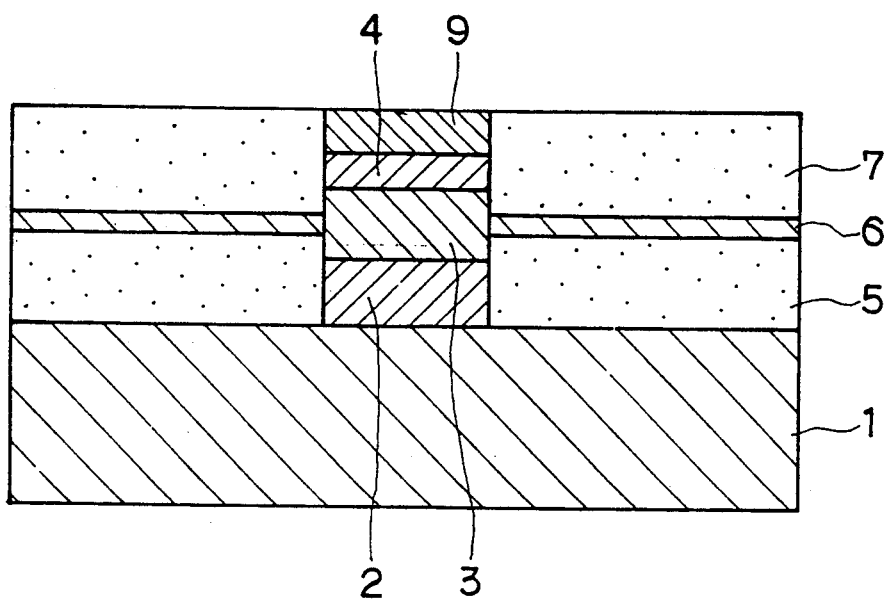

As shown in FIG. 6, the exposed insulating film 13 through the opening 14 is removed. On the exposed 3c-SiC monocrystal layer 2, a Si monocrystal layer 3 and a 3c-SiC layer 4 are allowed to grow. The layer 4, which is intended for an emitter region, may be polycrystal or amorphous. Concrete condition for this growth are as follows. The oxide film as the second insulating film 13 is removed by HF etching from the 3c-SiC monocrystal layer 2. After cleaning the etched portion 1 sccm of $SiH_4$ and 0.15 sccm of $B_2H_6$ are introduced and thermal treatment is performed at 1100° C. for 10 minutes by CVD to deposite Si of 500 Å in thickness to form a p-type Si monocrystal layer 3. Another thermal treatment is performed at 800° C. for 2 minutes by RFCVD (RF of 13.56 MHz) with 0.5 sccm of $Si_2H_6$ and 0.5 sccm of $C_2H_2$ as gaseous material source, 0.08 sccm of $PH_3$ as gaseous impurity, 3 slm of $H_2$ as carrier gas and 15 sccm of gaseous HCl added thereto, so that 3c-SiC of 300 Å in thickness is deposited to form a n-type 3c-SiC layer. 1 sccm of $SiH_4$ and 0.5 sccm of $PH_3$ are introduced and further thermal treatment is performed at 700° C. for 20 minutes to form a n-type poly Si layer 9 of 2000 Å in thickness.

The Si layer 3, 3c-SiC layer 4 and poly Si film 9 can be formed in turn with the same furnace only by changing introduced gas and temperature condition. For this reason, interfaces of the layers and films are not fouled and reliable layers and films can be formed.

Figure 7:
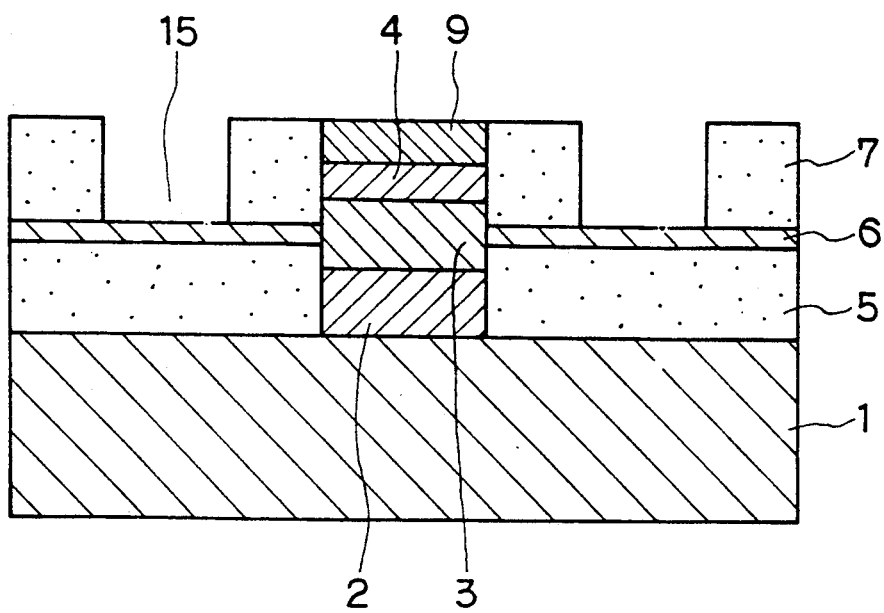
Figure 8:
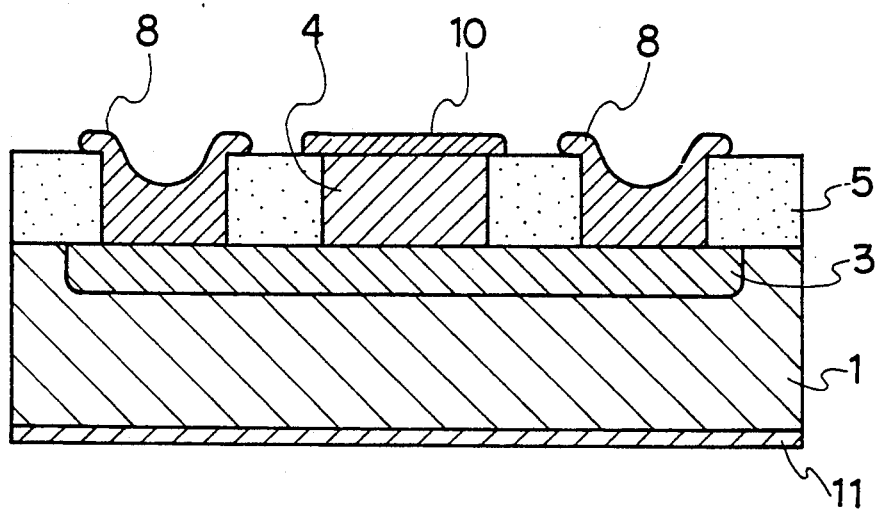
FIG. 8 is a cross section of a conventional HBT.

Finally, each electrode is formed with metal film to complete a HBT. Concretely, as shown in FIG. 7, a contact hole 15 is formed at a predetermined position on the insulating film 7 by RIE in order to form an electrode on the p-type poly Si film 6 connected with the base region 2. On the whole surface AlSi (1%) is deposited to be 5000 Å thickness by spputtering method, and deposited AlSi is removed by etching except for portions for a base electrode 8, an emitter electrode 10 and wiring therebetween. Also on the reverse side of the substrate a collector electrode is formed to complete a HBT.

The above embodiments are only an example, so that the HBT can be formed with other methods or other conditions.

As explained above, in the present invention, 3c-SiC layer having a wide energy band gap is employed for emitter region and base region in a heterojunction bipolar transistor, so that injection of positive holes from base to collector is prevented and the base region can be formed thin, resulting in a small amount of accumlated electrons. Thus, a HBT capable of rapidly operating and having a high amplification factor is obtained. This HBT can adjust itself to the use in high frequency band.

According to a method of the present invention, it is possible to carry out the selective growth of 3c-SiC in the same self-alignment structure. Thus, each junction capacitance can be lowered and more rapid operation can be realized. Further, 3c-SiC layer serving as a collector region is formed and the formed layer is protected with an insulating film for later treatment. This insulating film is removed, on forming the base region, by etching which gives small damage to the collector region. Thus semiconductor crystal layer is not damaged and high quality transistor can be produced.

In the structure of a transistor of the present invention, current flows only in a longitudinal direction but not in a lateral direction. Thus, a transistor of the present invention has a nearly one-dimentional structure, whereby reverse direction characteristic becomes good. Such transistor is effective for devices such as $I^2L$ circuit wherein reverse directional operation of transistor is utilized.

Though embodiments of the invention are described above, it is to be understood that the present invention is not limited to the above-mentioned embodiments, and various changes and modifications may be made in the invention without departing from the spirit and scope thereof.

What is claimed is:

1. A heterojunction bipolar transistor wherein: on a semiconductor substrate of a first conductive-type, a first conductive-type layer of 3c-SiC, a second conductive-type layer of Si and another first conductive-type layer 3c-SiC are formed in this order so that the two first conductive-type layers serve respectively as collector region and emitter region and the second conductive-type layer serves as base region, and wherein an electrically conductive film is sandwiched between insulating films and is connected with a side wall of the second conductive-type layer, and a base electrode is connected with the electrically conductive film.

* * * * *